(12) United States Patent
Nagasaka

(10) Patent No.: US 7,497,920 B2
(45) Date of Patent: Mar. 3, 2009

(54) METHOD OF MANUFACTURING SEMICONDUCTOR DEVICE

(75) Inventor: Takeshi Nagasaka, Takahama (JP)

(73) Assignee: DENSO CORPORATION, Kariya (JP)

( * ) Notice: Subject to any disclaimer, the term of this patent is extended or adjusted under 35 U.S.C. 154(b) by 724 days.

(21) Appl. No.: 11/218,524

(22) Filed: Sep. 6, 2005

(65) Prior Publication Data

US 2006/0054273 A1    Mar. 16, 2006

(30) Foreign Application Priority Data

Sep. 15, 2004    (JP)    ............................. 2004-268104

(51) Int. Cl.
  *B32B 37/10*    (2006.01)
  *B32B 38/04*    (2006.01)
  *B32B 38/10*    (2006.01)

(52) U.S. Cl. ...................... 156/247; 156/250; 156/256; 156/257; 156/268; 156/285; 156/344; 438/464; 438/976

(58) Field of Classification Search ................. 156/247, 156/250, 256, 257, 268, 285, 344, 272.2; 438/464, 976
See application file for complete search history.

(56) References Cited

U.S. PATENT DOCUMENTS 5,824,177 A * 10/1998 Yoshihara et al. ........... 156/250

6,475,881 B1 * 11/2002 Yamada ....................... 438/464
6,828,217 B2 * 12/2004 Nguyen et al. ............... 438/462
2002/0197770 A1 * 12/2002 Irie ............................. 438/114
2005/0101109 A1 * 5/2005 Chin et al. ................... 438/464

FOREIGN PATENT DOCUMENTS

JP    A-2003-197561    7/2003
JP    A-2003-318205    11/2003

* cited by examiner

*Primary Examiner*—Mark A Osele
*Assistant Examiner*—Christopher C Caillouet
(74) *Attorney, Agent, or Firm*—Posz Law Group, PLC

(57) ABSTRACT

In a manufacturing method of a semiconductor device, a tape having an adhesive material is bonded to a first surface of a semiconductor substrate so as to form a space between a groove portion and the adhesive material of the tape, the semiconductor substrate is divided into a plurality of chips by a dicing, and the adhesive material is drawn from a second surface of the semiconductor substrate opposite to the first surface so that the adhesive material enters into the space. Therefore, dicing remnants remaining in the space during the drawing adhere on the adhesive material, and can be removed together with the adhesive material when the semiconductor substrate is removed from the tape to form divided chips. Accordingly, the quality of the semiconductor device can be improved.

20 Claims, 9 Drawing Sheets

US 7,497,920 B2

METHOD OF MANUFACTURING SEMICONDUCTOR DEVICE

CROSS REFERENCE TO RELATED APPLICATION

This application is based on Japanese Patent Application No. 2004-268104 filed on Sep. 15, 2004, the contents of which are incorporated herein by reference in its entirety.

FIELD OF THE INVENTION

The present invention relates to a manufacturing method of a semiconductor device, in which a semiconductor substrate having plural integrated circuits is divided into plural chips by dicing.

BACKGROUND OF THE INVENTION

A manufacturing method of a semiconductor device using a dicing process is described, for example, in JP-A-2003-197561 and JP-A-2003-318205. In this method, after plural integrated circuits are formed in a semiconductor substrate, the semiconductor substrate is divided into plural chips. The semiconductor substrate is fixed onto a tape, and then the semiconductor substrate is divided into the chips by dicing, in order to prevent the divided chips from being scattered. Thereafter, the tape on each chip is removed.

However, in this dicing, dust such as silicon remnants, adhesive remnants, tape remnants caused during the dicing may be attached to the chips. In this case, the quality of the semiconductor device is deteriorated.

SUMMARY OF THE INVENTION

In view of the above-described problems, it is an object of the present invention to provide a method of manufacturing a semiconductor device, which improves the quality of the semiconductor device by removing dicing remnants (dust) caused during a dicing.

According to an aspect of the present invention, a method of manufacturing a semiconductor device includes a step of forming a groove portion recessed from a first surface of a semiconductor substrate having a plurality of integrated circuits, along a scribing line; a step of bonding a tape having an adhesive material to the first surface of the semiconductor substrate so as to form a space between the groove portion and the adhesive material of the tape; a step of dividing the semiconductor substrate into a plurality of chips by a dicing, wherein the dicing is performed along the scribing line; a step of drawing the adhesive material from a second surface of the semiconductor substrate, opposite to the first surface, so that the adhesive material enters into the space; and a step of removing the semiconductor substrate from the tape to form divided chips.

Because the adhesive material is drawn into the space between the groove portion and the adhesive material of the tape after the dicing is performed, dust such as dicing remnants can adhere to the adhesive material of the tape and can be removed together with the adhesive material of the tape. Accordingly, the quality of the semiconductor device is prevented from being deteriorated.

For example, the dicing is performed by using a dicing blade. Furthermore, in the dicing, a cutting-in depth of the dicing blade can be set so that the dicing blade contacts the adhesive material and a tape portion of the tape.

The drawing can be performed using a drawing device having a drawing wall portion for defining a drawing port. Furthermore, in the drawing, the drawing wall portion can be set to only contact an unavailable area outside available chips of the semiconductor substrate. In addition, a part of the space or all the space can be filled with the adhesive material during the drawing.

According to another aspect of the present invention, a manufacturing method includes a step of forming a groove portion recessed from a surface of a semiconductor substrate having a plurality of integrated circuits, along a scribing line; a step of bonding a tape having an adhesive material to the surface of the semiconductor substrate, having the groove portion, so as to form a space between the groove portion and the adhesive material of the tape; a step of drawing the adhesive material from a peripheral end of the semiconductor substrate through the space so that the adhesive material enters into the space; a step of dividing the semiconductor substrate into a plurality of chips through a dicing, wherein the dicing is performed along the scribing line; and a step of removing the semiconductor substrate from the tape to form divided chips. Therefore, dicing remnants caused in the dicing can adhere to the adhesive material, and can be removed together with the tape.

For example, in the forming of the groove portion, a cross section of the groove portion can be formed into a trapezoid shape having a tapered side wall relative to a bottom surface of the groove portion, can be formed into a triangular shape, can be formed into a round-cornered square shape, can be formed into a circular arc shape, or can be formed into a rectangular shape. Furthermore, a heating of the adhesive material can be performed before the drawing or during the drawing.

According to another aspect of the present invention, a method of manufacturing a semiconductor device includes a step of bonding a tape having an adhesive material to a first surface of a semiconductor substrate having a plurality of integrated circuits; a step of dividing the semiconductor substrate into a plurality of chips through a dicing so as to form a diced clearance in the semiconductor substrate; a step of drawing the adhesive material from a second surface of the semiconductor substrate, opposite to the first surface, so that the adhesive material enters into the diced clearance, and a step of removing the semiconductor substrate from the tape to form divided chips.

Even in this case, dicing remnants caused in the dicing can adhere to the adhesive material, and can be removed together with the tape.

BRIEF DESCRIPTION OF THE DRAWINGS

The above and other objects, features and advantages of the present invention will become more apparent from the following detailed description of preferred embodiments made with reference to the accompanying drawings, in which.

DETAILED DESCRIPTION OF PREFERRED EMBODIMENTS

First Embodiment

FIGS. 1A to 1E show manufacturing steps of a semiconductor device, in which plural integrated circuits are formed in a semiconductor substrate 1.

Figure 1A:
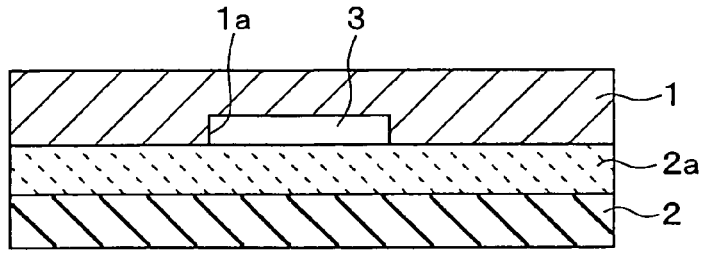
FIGS. 1A to 1E are cross-sectional views showing manufacturing steps of a semiconductor device according to a first embodiment of the present invention.

After the plural integrated circuits are formed in the semiconductor substrate 1, a groove portion 1a is formed on a back surface of the semiconductor substrate 1 by etching along a scribing line in a dicing area. Then, as shown in FIG. 1A, a tape 2 having an adhesive material 2a is bonded to the back surface of the semiconductor substrate 1, where the groove portion 1a is formed. For example, a UV tape can be typically used as the tape 2. Because the adhesive material 2a is bonded to the back surface of the semiconductor substrate 1 as shown in FIG. 1A, a space 3 is formed between the back surface of the semiconductor substrate 1 and the adhesive 2a of the tape 2, due to the groove portion 1a.

Figure 1B:
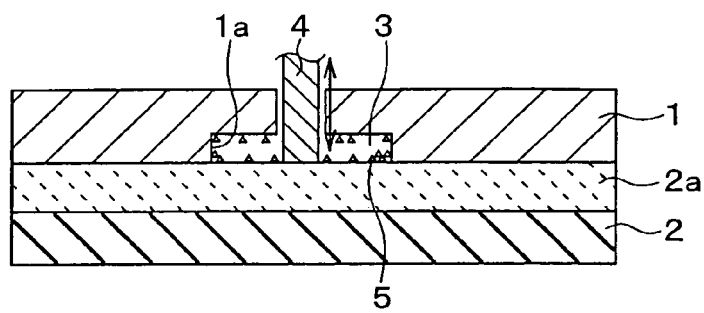
Figure 1C:
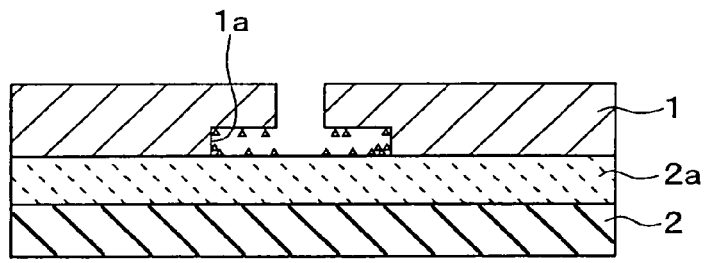

Then, as shown in FIG. 1B, the semiconductor substrate 1 is divided into plural chips (chip units) along the scribing line, by using a dicing blade 4. A tip end of the dicing blade 4 is inserted into the space 3 formed due to the groove portion 1a. Therefore, dicing remnants 5 (dust) due to the dicing of the dicing plate 4 remain in the space 3, as shown in FIG. 1C.

Figure 1D:
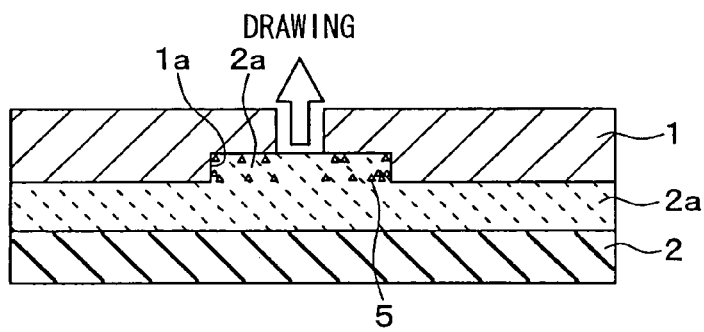

FIG. 1D shows a drawing step (i.e., suction step) for removing the dicing remnants 5. Specifically, as shown in FIG. 1D, the drawing is performed from a front surface side of the semiconductor substrate 1, opposite to the back surface to which the tape 2 is bonded. Therefore, the adhesive material 2a of the tape 2 is drawn into the space 3 through a divided portion of the semiconductor substrate 1, divided by the dicing plate 4. Accordingly, the drawn adhesive material 2a is filled in the space 3 of the groove portion 1a, and the dicing remnants 5 remaining in the space 3 of the groove portion 1a adhere to the adhesive material. In the drawing step of FIG. 1D, the tape 2 can be heated for softening the adhesive material 2a of the tape 2. In this case, the adhesive material 2a can be easily introduced into the space 3.

Figure 2:
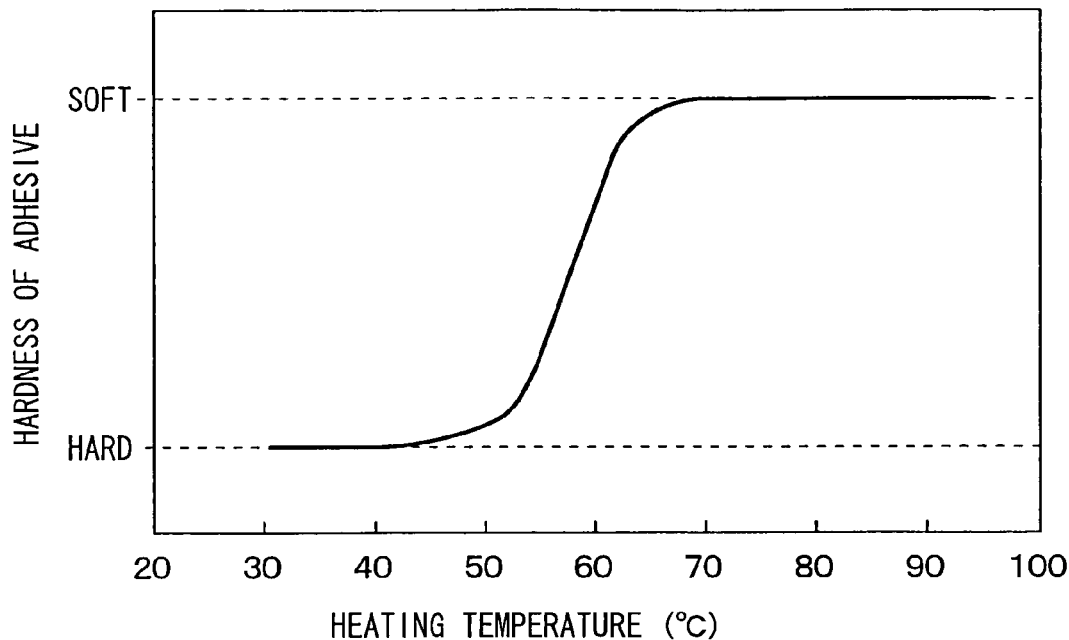
FIG. 2 is a graph showing the relationship between a heating temperature and a hardness of an adhesive material.

FIG. 2 shows a relationship between a heating temperature and a hardness of the adhesive material 2a. As shown in FIG. 2, the adhesive material 2a starts softening when the heating temperature is higher than about 40° C., and the adhesive material 2a is quickly softened when the heating temperature becomes higher than about 50° C. Furthermore, when the heating temperature for heating the adhesive material 2a becomes higher than about 60° C., the adhesive material 2a becomes approximately a softest state. Accordingly, in the example shown in FIG. 2, when the heating temperature of the adhesive material 2a is heated in a range between 40° C. and 60° C., the adhesive material 2a is easily introduced into the space 3 formed due to the groove portion 1a.

Figure 1E:
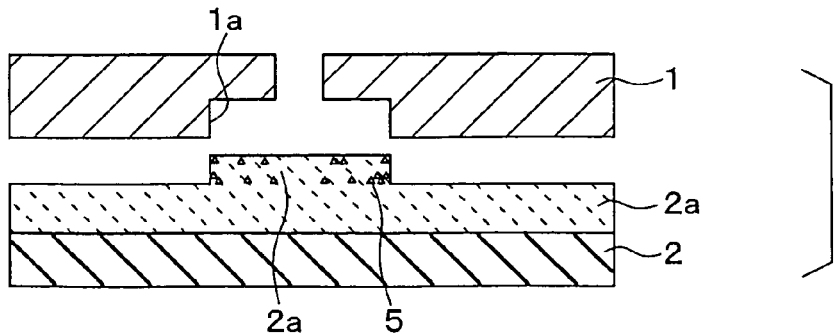

Next, as shown in FIG. 1E, the semiconductor substrate 1 is removed from the tape 2. That is, the chips, formed by the dicing, are removed from the tape 2, so that a semiconductor device is completely divided into the chips. Here, the chips can be formed by the same unit, and can be formed by different units.

In this embodiment, after the dicing, the dicing remnants are made to adhere to the adhesive material 2a of the tape 2. Therefore, the dicing remnants 5 attached to the chips can be removed together with the tape 2 while the tape 2 is removed from the semiconductor substrate 1.

Furthermore, in this embodiment, the drawing of the adhesive material 2a is performed from the front surface, opposite to the back surface to which the tape 2 is bonded. Therefore, the adhesive material 2a of the tape 2 can enter into the space 3 by drawing. As a result, the dicing remnants remaining in the space 3 of the groove portion 1a can be effectively removed while the chips are separated from the tape 2. Accordingly, the quality of the semiconductor device having the separated chips can be prevented from being deteriorated due to dust such as the dicing remnants.

Second Embodiment

Figure 3A:
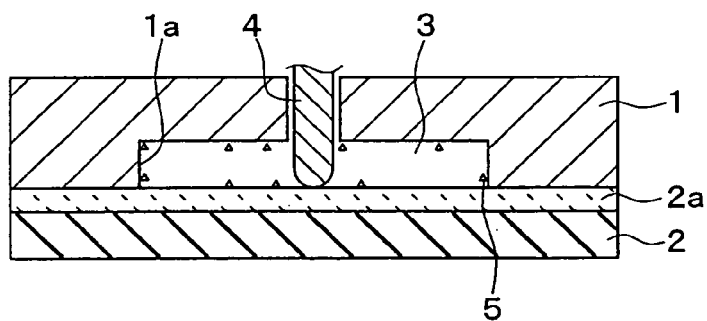
FIG. 3A is a schematic sectional view showing a cutting-in depth of a dicing blade according to the first embodiment.

In the second embodiment, the cutting-in depth (insertion depth) of the dicing blade 4 is changed as compared with the first embodiment. FIG. 3A shows a schematic sectional view showing the cutting-in depth of the dicing blade 4, which corresponds to the state in FIG. 1B. As shown in FIG. 3A, in the above-described first embodiment, the dicing blade 4 is inserted to not actually contact the adhesive material 2a or to slightly contact the adhesive material 2a. That is, the insertion depth of the adhesive material 2a is set so that the adhesive material of the tape 2 is not deformed by the dicing blade 4.

Figure 3B:
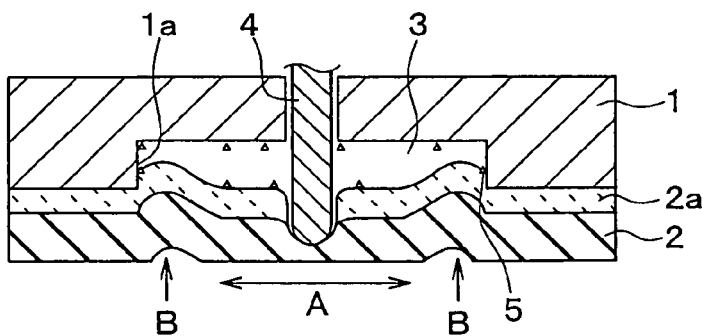
FIG. 3B is a schematic sectional view showing a cutting-in depth of a dicing blade according to a second embodiment of the present invention.

In the second embodiment, as shown in FIG. 3B, the insertion depth of the dicing blade 4 is set to contact the adhesive material 2a and a tape portion of the tape 2. That is, the tape 2 including the adhesive material 2a is deformed by the dicing blade 4 inserted from the front surface of the semiconductor substrate 1.

In the second embodiment, the tape 2 extends in the direction A of FIG. 3B by the force applied from the dicing blade 4, and the extended tape 2 is bent and enters into the space 3 at the positions B of FIG. 3B. Because the tape 2 including the adhesive material 2a enters into the space 3 of the groove portion 1a, the dicing remnants remaining in the space 3 can be removed.

In the second embodiment, the other manufacturing steps and structures may be formed similarly to the above-described first embodiment.

Third Embodiment

In the third embodiment, the shape of the groove portion 1a formed on the back surface of the semiconductor substrate 1 is changed as compared with the above-described embodiments.

Figure 4A:
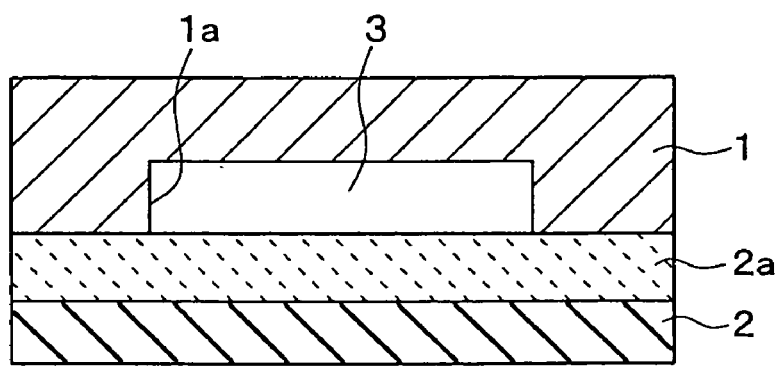
FIG. 4A is a cross-sectional view showing a groove portion of a semiconductor substrate according to the first embodiment.

FIG. 4A shows a groove portion 1a of a semiconductor substrate, corresponding to that of FIG. 1A. As shown in FIG. 4A, the groove portion 1a has a rectangular shape in cross section. That is, the side walls of the groove portion 1a are made perpendicular to the bottom surface of the groove portion 1a.

Figure 4B:
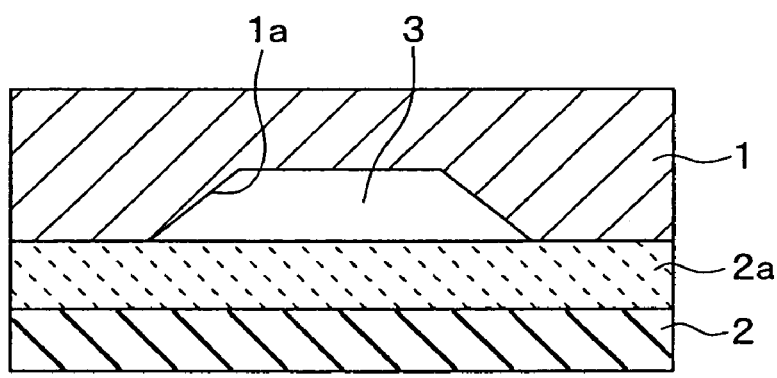
FIG. 4B is a cross-sectional view showing a groove portion of a semiconductor substrate according to a third embodiment of the present invention.

In the third embodiment, as shown in FIG. 4B, the groove portion 1a is formed into a trapezoid shape. That is, the side walls of the groove portion 1a are not perpendicular to the bottom surface of the groove portion 1a, but are tapered. Therefore, the space 3 due to the groove portion 1a is enlarged toward the adhesive material 2a of the tape 2.

Because the side wall of the groove portion 1a is tapered, the adhesive material 2a of the tape 2 easily enters into the space 3 of the groove portion 1a. Therefore, the dicing remnants 5 can be easily removed.

Figure 5A:
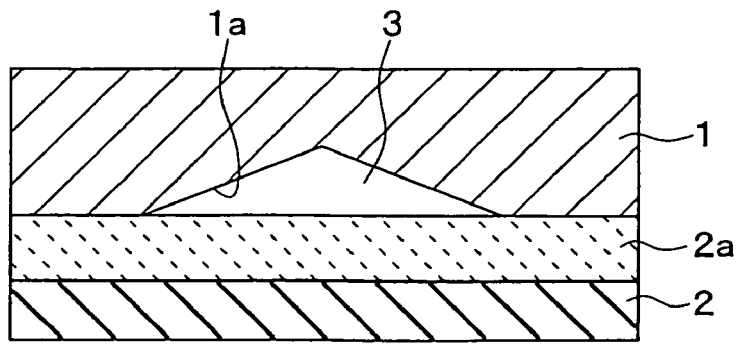
FIGS. 5A to 5C are cross-sectional views each showing a groove portion of a semiconductor substrate, according to modifications of the third embodiment.
Figure 5B:
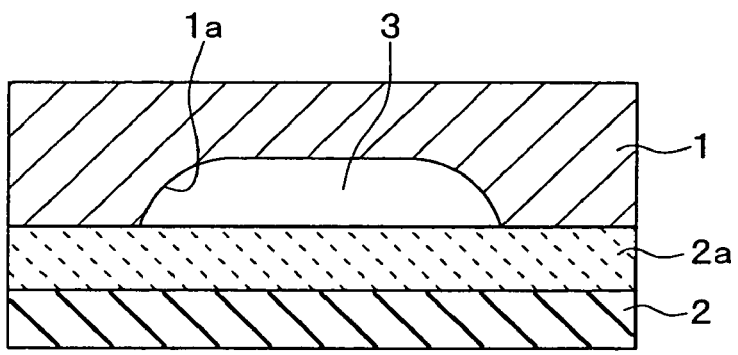
Figure 5C:
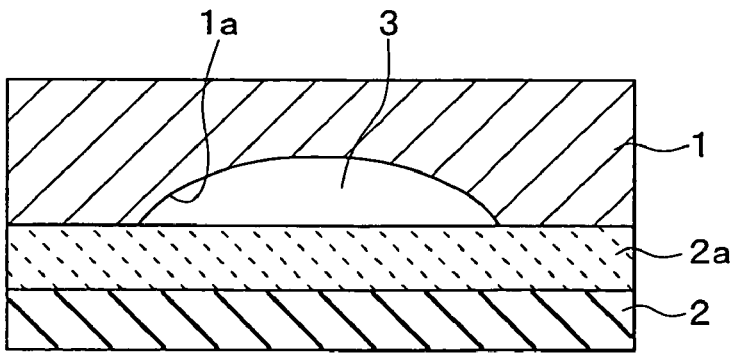

In the example shown in FIG. 4B, the groove portion 1a is formed in a trapezoid shape so that the space 3 is enlarged toward the tape 2a. However, the shape of the groove portion 1a can be changed as shown in FIGS. 5A-5C, so that the dimension of the space 3, parallel to the surface of the tape 2, is enlarged toward the adhesive material 2a. For example, the groove portion 1a can be formed into a triangle shape in cross-section as shown in FIG. 5A, can be formed into a shape with a round-cornered square in cross-section as shown in FIG. 5B, or can be formed into a circular arc shape as shown in FIG. 5C.

The shape of the groove portion 1a can be changed by changing an etching condition such as an etching material, an etching time, etc. In the third embodiment, the other parts can be set similarly to the above-described first embodiment.

Other Embodiments

Although the present invention has been described in connection with some preferred embodiments thereof with reference to the accompanying drawings, it is to be noted that various changes and modifications will become apparent to those skilled in the art.

For example, in the above-described first embodiment, all the space 3 of the groove portion 1a is filled with the adhesive material 2a of the tape 2 in the drawing, so that the dicing remnants 5 adhere on the adhesive material 2a. However, the adhesive material 2a may be partially filled in the space 3 of the groove portion 1a.

Figure 6A:
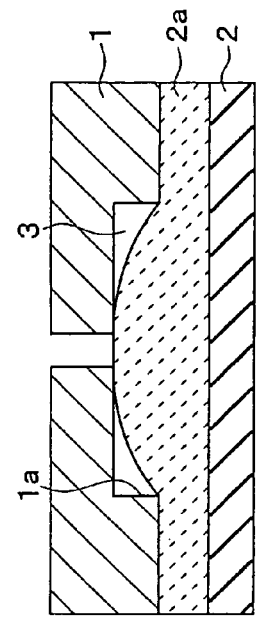
FIG. 6A is a schematic sectional view showing a state of an adhesive material before a drawing step.
Figure 6B:
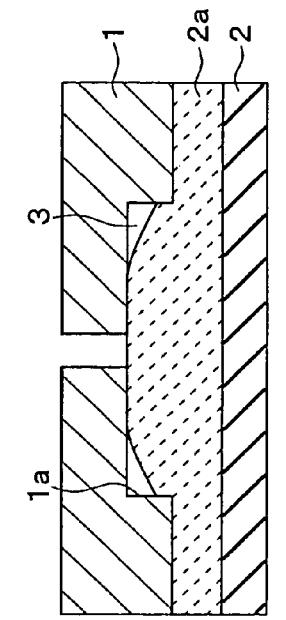
FIGS. 6B-6H are schematic sectional views each showing a state of the adhesive material after the drawing step, according to another embodiment of the present invention.
Figure 6C:
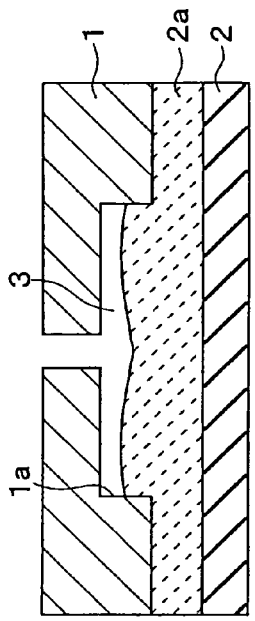
Figure 6D:
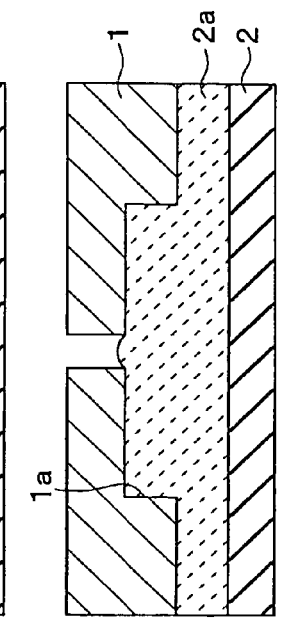
Figure 6E:
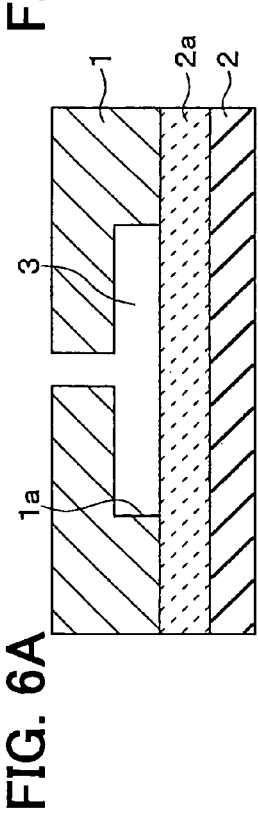
Figure 6F:
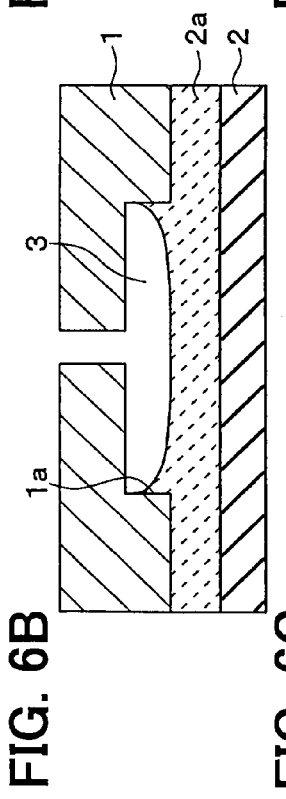
Figure 6G:
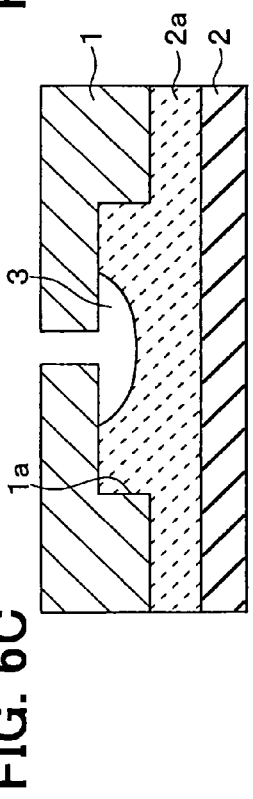
Figure 6H:
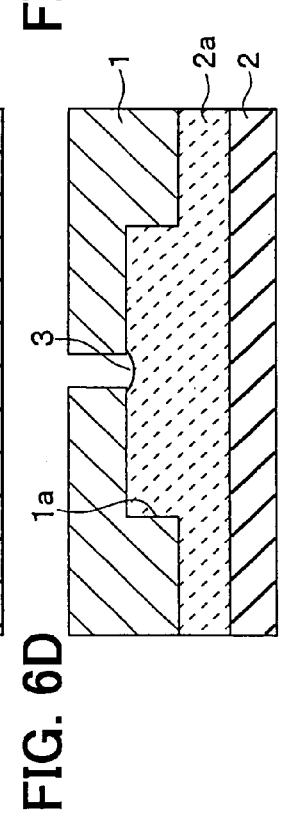

FIG. 6A shows a state before the drawing (suction) is performed, and FIGS. 6B-6H show states after the drawing is performed. As shown in FIGS. 6B-6G, the adhesive material 2a may be filled in a part of the space 3. Alternatively, the adhesive material 2a may be filled in all the space 3 and may be further filled in a diced clearance between the chips, as shown in FIG. 6H.

Figure 7A:
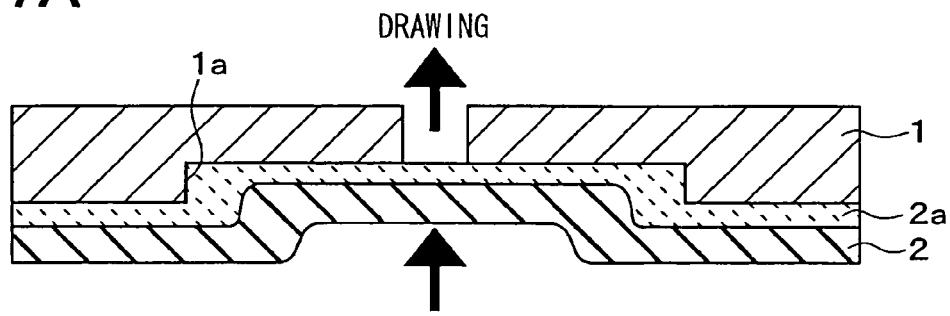
FIGS. 7A and 7B are schematic sectional views each showing a state in which a tape and an adhesive material are inserted into a space of a groove portion, according to another embodiment of the present invention.
Figure 7B:
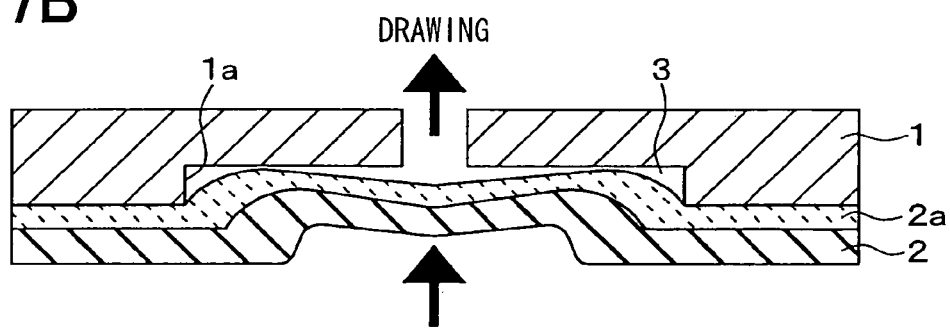

Furthermore, in the drawing, the tape 2 may be inserted into the space 3, together with the adhesive material 2a, as shown in FIGS. 7A and 7B. For example, all the space 3a may be filled with the tape 2 including the adhesive material 2a as shown in FIG. 7A, or a part of the space 3 may be filled with the tape 2 including the adhesive material 2a.

Figure 8:
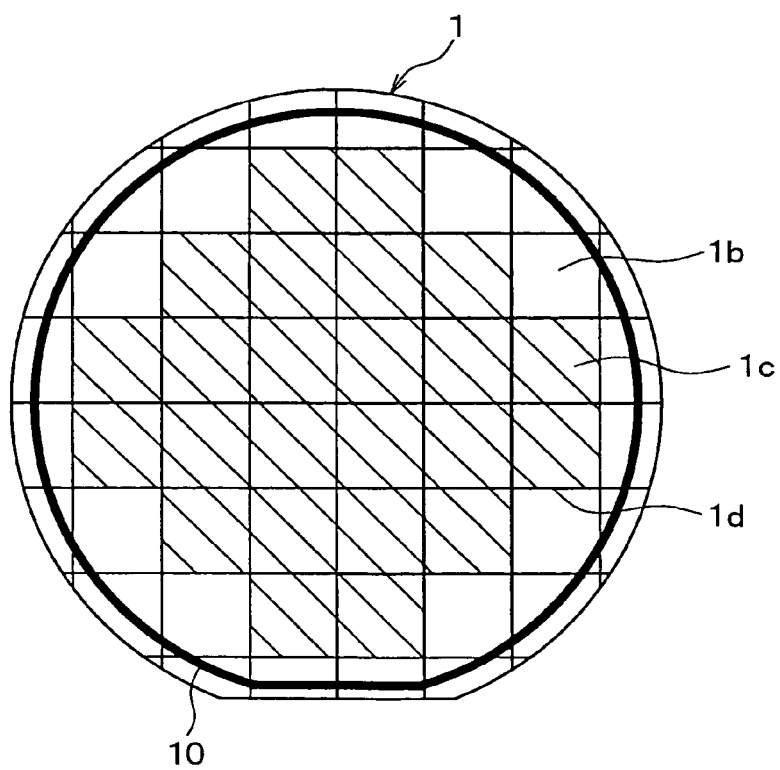
FIG. 8 is a schematic diagram showing a contacting area between a semiconductor substrate and a drawing wall portion of a drawing device in a drawing step, according to the embodiments of the present invention.

FIG. 8 shows a drawing wall portion 10 defining a drawing port of a drawing device. The drawing wall portion 10, through which the drawing of the adhesive material 2a is performed, can be set in an unavailable area where at least an unavailable chip 1b is positioned. That is, the drawing wall portion 10 can be set outside an available area where available chips 1c (effective chips) are arranged. In this case, a damage of the available chips during the drawing can be prevented.

In the above-described embodiments, the UV tape is used as the tape 2, as an example. However, other kind tapes can be used as the tape 2. If the UV tape is used as the tape 2, the tape 2 including the adhesive material 2a can be easily removed from the semiconductor substrate 1 only by illuminating UV light. Further, when the UV tape is used as the tape 2, it can easily remove the adhesive 2a of the tape 2 even when the shape of the adhesive material 2a is deformed by the drawing.

In the above-described embodiments, the dicing is performed using the dicing blade 4, as an example, for dividing the semiconductor substrate 1 into chips. However, the dicing of the semiconductor substrate 1 can be performed by using a laser dicing, for example.

Furthermore, during the drawing step after the dicing, the semiconductor 1 can be vibrated by supersonic wave. When the semiconductor substrate 1 is vibrated, the dicing remnants 5 fall on the adhesive material 2a, thereby the dicing remnants 5 can be easily bonded to the adhesive material 2a. The drawing can be continuously performed for a time by one step, or can be performed interruptingly by plural steps.

Figure 11:
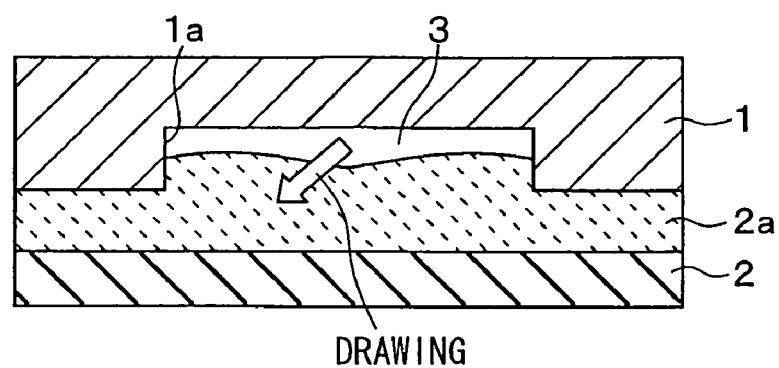
FIG. 11 is a cross-sectional view showing a drawing step for drawing an adhesive material before a dicing step, according to another embodiment of the present invention.

In the above-described embodiments, the drawing step is performed after the dicing step. However, the drawing step can be performed before the dicing step, as shown in FIG. 11. For example, in a case where the groove portion 1a is formed in all area of the scribing area, the space 3 between the groove portion 1a of the semiconductor substrate 1 and the tape 2 communicates with an exterior at the outer peripheral end of the semiconductor substrate 1. Therefore, the adhesive material can be drawn into the space 3 from the outer peripheral end of the semiconductor substrate 1 through the space 3, as shown in FIG. 11. Accordingly, the adhesive material can be filled in at least a part of the space 3 before the dicing. Thereafter, when the dicing step is performed, the dicing remnants 5 caused during the dicing can adhere onto the adhesive material 2a in the space 3. Thus, when the tape 2 is removed from the semiconductor substrate 1, the dicing remnants 5 can be removed together with the adhesive material 2a. Even in this case, the shape of the groove portion 1a can be suitably changed similarly to the above-described embodiments.

In the above-described embodiments, the groove portion 1a is provided on the scribing line. However, even when the groove portion 1a is not provided in the area where the dicing is performed, the dicing remnants 5 can be removed together with the adhesive material 2a.

Figure 9A:
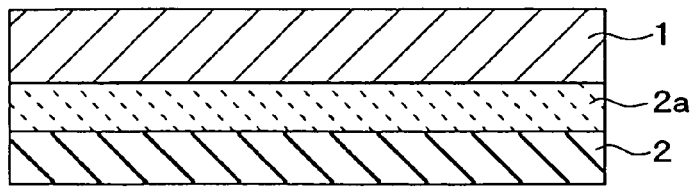
FIGS. 9A-9E are cross-sectional views showing manufacturing steps of a semiconductor device in a case where a groove portion is not provided in the semiconductor substrate, according to anther embodiment of the present invention.
Figure 9B:
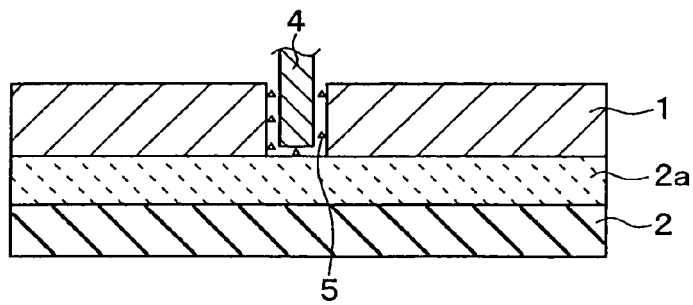
Figure 9C:
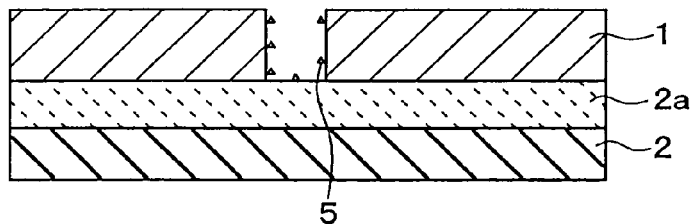
Figure 9D:
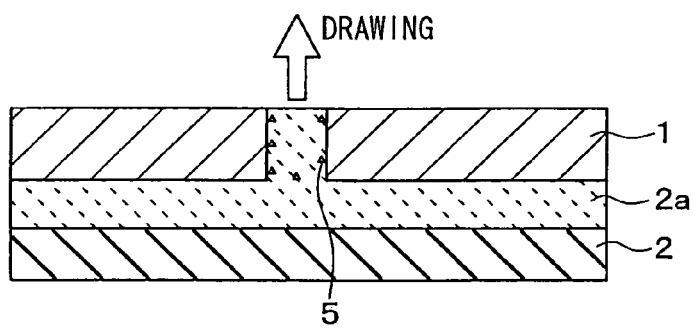
Figure 9E:
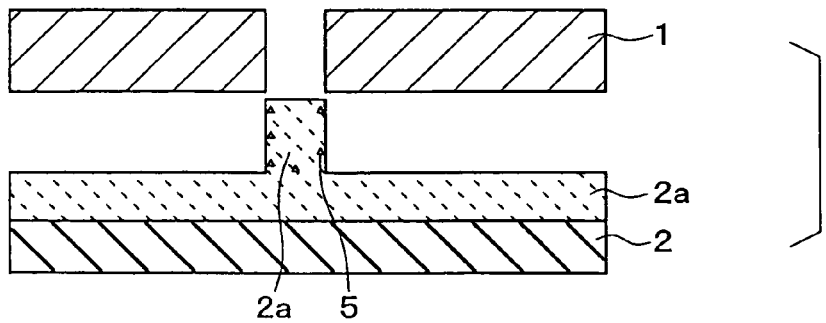

FIG. 9A shows a state before the semiconductor substrate 1 is divided into chips, FIG. 9B shows a state after the semiconductor substrate 1 is divided into chips by using the dicing blade 4. After the dicing step in FIG. 9B, the dicing remnants 5 remain in the diced clearance between the divided chips as shown in FIG. 9C. Thereafter, as shown in FIG. 9D, the adhesive material 2a is drawn from the diced clearance portion of the semiconductor substrate 1. Accordingly, the adhesive material 2a enters into the diced clearance portion of the semiconductor substrate 1 as shown in FIG. 9D. Thus, the dicing remnants 5 can be removed together with the tape 2, as shown in FIG. 9E.

Figure 10A:
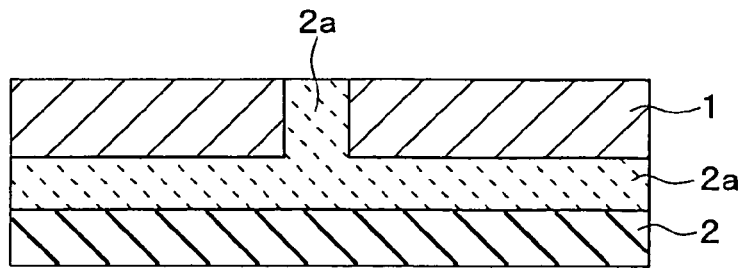
FIGS. 10A-10D are cross-sectional views each showing a state of an adhesive material in a drawing step, according to another embodiment of the present invention.
Figure 10B:
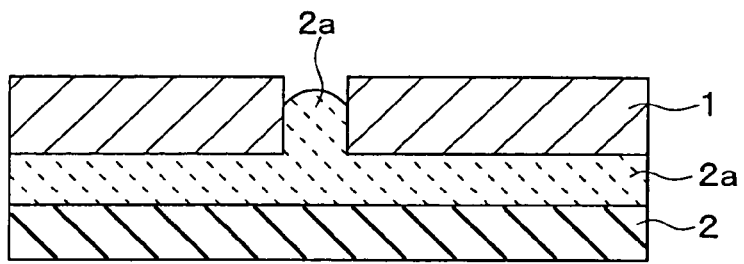
Figure 10C:
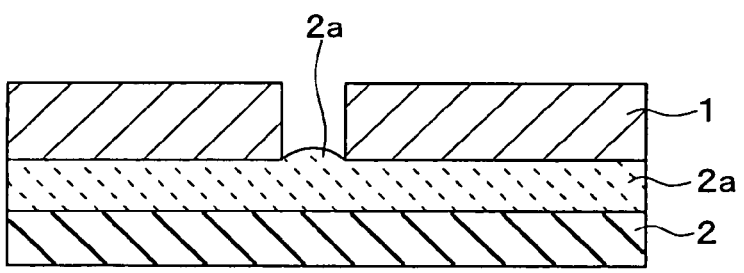
Figure 10D:
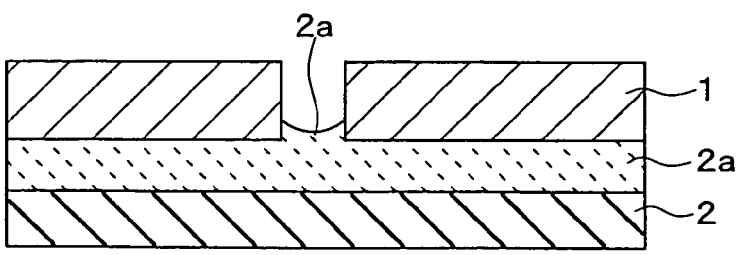

Even in this case without having the groove portion 1a in the semiconductor substrate 1, all the space of the diced clearance portion can be filled with the adhesive material 2a as shown in FIG. 10A, or a part of the diced clearance portion can be filled with the adhesive material 2a as shown in FIGS. 10B-10D.

While the invention has been described with reference to preferred embodiments thereof, it is to be understood that the invention is not limited to the preferred embodiments and constructions. The invention is intended to cover various modification and equivalent arrangements. In addition, while the various elements of the preferred embodiments are shown in various combinations and configurations, which are preferred, other combinations and configuration, including more, less or only a single element, are also within the spirit and scope of the invention.

What is claimed is:

1. A method of manufacturing a semiconductor device, comprising:
    forming a groove portion recessed from a first surface of a semiconductor substrate having a plurality of integrated circuits, along a scribing line;
    bonding a tape having an adhesive material to the first surface of the semiconductor substrate so as to form a space between the groove portion and the adhesive material of the tape;
    dividing the semiconductor substrate into a plurality of chips by a dicing, wherein the dicing is performed along the scribing line;
    drawing the adhesive material from a second surface of the semiconductor substrate, opposite to the first surface, so that the adhesive material enters into the space; and
    removing the semiconductor substrate from the tape to form divided chips.

2. The method according to claim 1, wherein:
    the dicing is performed by using a dicing blade; and
    in the dicing, a cutting-in depth of the dicing blade is set so that the dicing blade contacts the adhesive material and a tape portion of the tape.

3. The method according to claim 1, wherein:
    the drawing is performed using a drawing device having a drawing wall portion for defining a drawing port; and
    in the drawing, the drawing wall portion only contacts an unavailable area outside available chips of the semiconductor substrate.

4. The method according to claim 1, wherein all the space is filled with the adhesive material during the drawing.

5. The method according to claim 1, wherein,
    in the forming of the groove portion, the groove portion is formed into a trapezoid shape in cross section having a tapered side wall relative to a bottom surface of the groove portion.

6. The method according to claim 1, wherein,
    in the forming of the groove portion, the groove portion is formed into a triangular shape in cross section.

7. The method according to claim 1, wherein,
    in the forming of the groove portion, the groove portion is formed into a round-cornered square shape in cross section.

8. The method according to claim 1, wherein,
    in the forming of the groove portion, the groove portion is formed into a circular arc shape in cross section.

9. The method according to claim 1, wherein,
    in the forming of the groove portion, the groove portion is formed into a rectangular shape in cross section.

10. The method according to claim 1, wherein,
    in the drawing, the tape including the adhesive material enters into the space.

11. The method according to claim 1, further comprising heating the adhesive material before the drawing or during the drawing.

12. A method of manufacturing a semiconductor device, comprising:
    forming a groove portion recessed from a surface of a semiconductor substrate having a plurality of integrated circuits, along a scribing line;
    bonding a tape having an adhesive material to the surface of the semiconductor substrate, having the groove portion, so as to form a space between the groove portion and the adhesive material of the tape;
    drawing the adhesive material from a peripheral end of the semiconductor substrate through the space so that the adhesive material enters into the space;
    dividing the semiconductor substrate into a plurality of chips by a dicing, wherein the dicing is performed along the scribing line; and
    removing the semiconductor substrate from the tape to form divided chips.

13. The method according to claim 12, wherein,
    in the forming of the groove portion, the groove portion is formed into a trapezoid shape in cross section having a tapered side wall relative to a bottom surface of the groove portion.

14. The method according to claim 12, wherein,
    in the forming of the groove portion, the groove portion is formed into a triangular shape in cross section.

15. The method according to claim 12, wherein,
    in the forming of the groove portion, the groove portion is formed into a round-cornered square shape in cross section.

16. The method according to claim 12, wherein,
    in the forming of the groove portion, the groove portion is formed into a circular arc shape in cross section.

17. The method according to claim 12, wherein,
    in the drawing, the tape including the adhesive material enters into the space.

18. The method according to claim 12, further comprising heating the adhesive material before the drawing or during the drawing.

19. A method of manufacturing a semiconductor device, comprising:
    bonding a tape having an adhesive material to a first surface of a semiconductor substrate having a plurality of integrated circuits;
    dividing the semiconductor substrate into a plurality of chips by a dicing so as to form a diced clearance in the semiconductor substrate;
    drawing the adhesive material from a second surface of the semiconductor substrate, opposite to the first surface, so that the adhesive material enters into the diced clearance; and
    removing the semiconductor substrate from the tape to form divided chips.

20. The method according to claim 19, further comprising heating the adhesive material before the drawing or during the drawing.

* * * * *